United States Patent [19]

Ipri

[11] 4,217,688
[45] Aug. 19, 1980

[54] FABRICATION OF AN INTEGRATED INJECTION LOGIC DEVICE INCORPORATING AN MOS/BIPOLAR CURRENT INJECTOR

[75] Inventor: Alfred C. Ipri, Princeton, N.J.

[73] Assignee: RCA Corporation, New York, N.Y.

[21] Appl. No.: 969,486

[22] Filed: Dec. 14, 1978

Related U.S. Application Data

[62] Division of Ser. No. 914,870, Jun. 12, 1978, abandoned.

[51] Int. Cl.³ .............................................. B01J 17/00
[52] U.S. Cl. ...................................... 29/571; 29/577R; 29/578; 357/43; 357/46
[58] Field of Search ......................... 29/571, 577, 578; 357/46, 43

[56] References Cited

U.S. PATENT DOCUMENTS

| | | | |
|---|---|---|---|
| 3,608,189 | 9/1971 | Gray | 29/571 |
| 3,622,812 | 11/1971 | Crawford | 357/43 |
| 4,063,273 | 12/1977 | Mueller | 357/46 |
| 4,124,933 | 11/1978 | Nicholas | 29/578 |

Primary Examiner—W. C. Tupman
Attorney, Agent, or Firm—Birgit E. Morris; D. S. Cohen; Lawrence P. Benjamin

[57] ABSTRACT

A novel semiconductor configuration is presented utilizing a narrow, gate-like (base) structure formed of, for example, a floating polycrystalline silicon line, that is capable of modulating both the number and type of carriers (electrons or holes) flowing thereunder, between a pair of similarly doped, separated regions. One particular structure described is a four terminal I²L configuration where the inverter transistor can function in either the mode of an MOS device or the mode of a bipolar device.

1 Claim, 12 Drawing Figures

FABRICATION OF AN INTEGRATED INJECTION LOGIC DEVICE INCORPORATING AN MOS/BIPOLAR CURRENT INJECTOR

This is a division, of application Ser. No. 914,870, filed 6-12-78, now abondoned.

This invention relates to semiconductor devices and in particular to the fabrication of an I²L device that functions as either a narrow basewidth lateral bipolar or an MOS current injector.

Integrated Injection Logic (I²L) devices using linear bipolar transistors have been known for some time and are finding increasing use especially in switching circuits. While these devices have the advantage of faster operation and lower power consumption than T²L logic, for example, I have found that I am able to achieve with them higher speed and higher packing densities than heretofore possible. This is accomplished by fabricating the devices using a technique that produces a significant reduction in the basewidth in the transistor.

I²L in its simplest form, is a pair of complementary bipolar transistors. A vertical NPN transistor operates as an inverter while a lateral PNP transistor serves as both a current source (injector) and a load for the NPN transistor. No ohmic resistors are required for either the current source or load function, hence, high packing densities are achieved.

In the past, lateral transistors were constructed using photolithographic techniques to define the base region. However, since injected carriers (in the base region) have a finite lifetime it is desirable to improve the lifetime of the present bipolar devices by constructing it with a narrow basewidth in order to reduce the electron transit time. A narrow basewidth transistor will result in higher switching speed as well as higher gain. Using the prior art photolithographic techniques a basewidth of about 5 $\mu$m is obtainable. With the described process a basewidth of about 0.5 $\mu$m is easily obtainable.

In my copending application entitled "THE FABRICATION OF AN INTEGRATED INJECTION LOGIC DEVICE WITH NARROW BASEWIDTH", Ser. No. 914,901, 6-12-78 now U.S. Pat. No. 4,200,878, 4-29-80, filed concurrently herewith and assigned to the same assignee as the subject application I describe a method of fabricating linear bipolar transistors particularly useful in I²L devices. In one embodiment of my invention described herein the conventional bipolar injector portion of the I²L device is replaced with a configuration that is capable of being independently operated as either a bipolar injector or as a MOS injector, at the user's option. In another embodiment, the conventional bipolar injector portion of the I²L device is replaced with an MOS device. In all instances, the novelty of the subject invention resides in the use of a narrow, floating polycrystalline silicon (polysilicon) line that is capable of modulating the number and type of carriers (electrons or holes) flowing thereunder between a pair of similarly doped, separated regions. In one instance, when connected to function as a linear bipolar device the polycrystalline line operates as a base electrode and when operated as a MOS device the polycrystalline line is operated as a gate electrode. Thus, the particular structure described is a four terminal device that is capable of being made to function either in the bipolar mode or in the MOS mode depending on the connections of the four terminals of the device. This device, also, has particular utility in an I²L configured circuit.

When my device is operated in the MOS mode, the classic PNP bipolar injector is replaced with an MOS injector. The most significant advantage resulting from this replacement of a bipolar injector with an MOS injector resides in the absence of charge loss associated with bipolar devices thereby significantly raising the efficiency of the I² device.

While in the following exegesis the MOS device will be described in terms of a P channel device operating in the depletion mode, it will be obvious to those skilled in the art that an N channel device can be fabricated without departing from the inventive concept contained herein. Further, while my invention will be presented in terms of utilizing bulk silicon, it will be obvious to those skilled in the art that this device may be fabricated on an insulative substrate such as spinel, monocrystalline beryllium oxide or sapphire to form a device generally referred to as silicon-on-sapphire (SOS).

Figure 1:
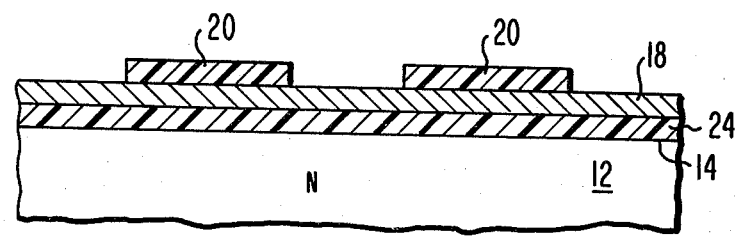
FIGS. 1-5 depict the processing steps for one embodiment of my invention.

Referring now to FIG. 1 there is shown a preferred method of fabricating an I²L device using narrow basewidth, lateral bipolar MOS transistors wherein a body of semiconductor material 12 is provided with a common boundary surface 14 thereon. Surface 14 is provided with a layer of dielectric or dielectrics 24 which may be formed either by the oxidation of surface 14 of silicon body 12 or by the thermal decomposition of silane in an oxidizing atmosphere. After layer 24 is formed, the exposed surface thereof is provided with a layer 18 of polycrystalline silicon (polysilicon) formed by the pyrolytic decomposition of a silicon bearing material, such as silane ($SiH_4$) followed by a layer 20 of masking oxide, which layer may be deposited using any one of many well known techniques. Layer 20 is then provided with a patterned layer of photoresist (not shown) and the exposed portions of masking oxide layer 20 is then etched down to the polysilicon layer 18 using a buffered HF solution. This allows the remaining, unetched portions of layer 20 (shown on layer 18) to act as a mask for the subsequent etching of polycrystalline layer 18. The now exposed portions of polysilicon layer 18 are removed by etching in a buffered potassium hydroxide etchant which not only removes the exposed polysilicon but will generally etch (undercut) the edges of the polysilicon layer 18 which lie under mask layer 20.

Figure 2:
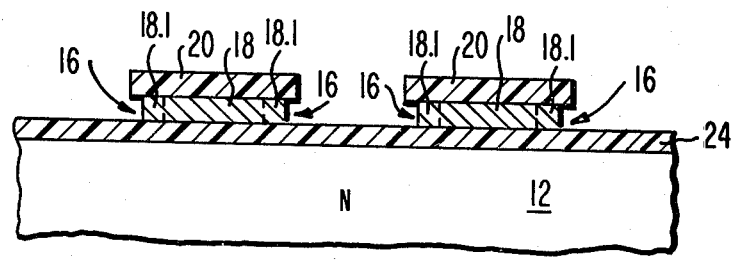

Referring now to FIG. 2 it will be seen that the next step is to subject the structure to a P type dopant. The particular dopant used is boron in the form of diborane. As indicated by arrows 16, the doping gas will contact only the exposed, undercut edges of polysilicon layer 18 so that the dopant diffuses laterally into layer 18, from the exposed edges inwardly thereof. This procedure serves to form P type doped polysilicon lines 18.1. Since the diffusion constant of polysilicon layers is well known, the diffusion of the dopant into layer 18 may be accurately controlled by monitoring both the time and temperature of this diffusion step. Accordingly, doped polysilicon strips 18.1 can be accurately controlled to provide the required narrow widths.

Figure 3:
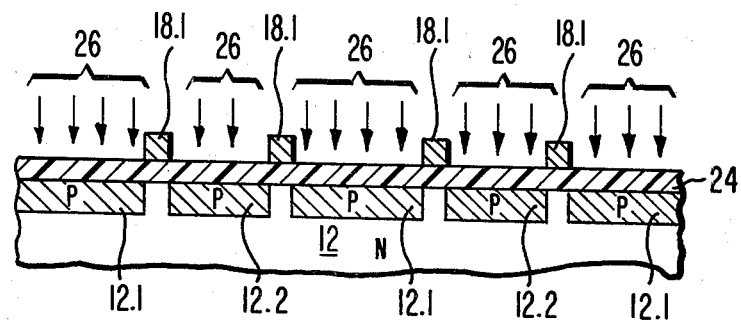

As shown in FIG. 3 doped strips 18.1 appear wherever the exposed edges of polysilicon layer 18 react with the boron dopant. In the following steps, I will describe a device, and the fabrication thereof, wherein the emitter and collector (source and drain) electrodes will be doped to the same level. However, as described in my co-pending application filed concurrently herewith, these electrodes may be doped to different levels.

After the boron doping step leading to the formation of doped lines 18.1, masking layer 20 is removed by using a buffered HF (hydrogen flouride) solution to expose both the doped (18.1) and undoped (18) parts of the polysilicon layer. The structure is now subjected to an etching solution consisting of, for example, an aqueous hydrazine solution or a solution of potassium hydroxide in propanol in order to remove the undoped polysilicon parts 18 and allow the doped lines 18.1 to remain. These etchants and their use are described in detail in U.S. Pat. No. 3,738,880.

Using doped lines 18.1 as a mask to provide alignment, the substrate below surface 14 is now subjected to a modification, as indicated by arrows 26, to delineate the edges of the base (gate) region and to form both the emitter and collector (source and drain) regions 12.1 and 12.2 respectively. By way of example, since body 12 is initially an N type semiconductor, the modification may take the form of an implantation of boron at a dose of about $1 \times 10^{16}$ ions/cm$^2$ at about 50 KeV which will result in a concentration of conductivity modifiers of about $10^2$/cm$^3$ in both regions 12.1 and 12.2.

Figure 4:
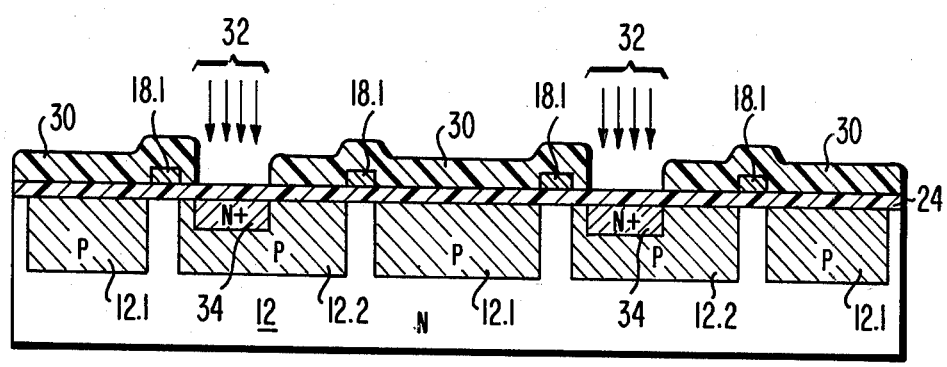

Referring now to FIG. 4 it will be seen that after the formation of regions 12.1 and 12.2 the structure is provided with a patterned layer of photoresist 30 after which it is subjected to a second surface modification step, as shown by arrows 32, to produce N regions 34 in each previously formed P well 12.2. This too, may be an implant, where phosphorus is utilized as the dopant gas to produce regions 34.

Figure 5:
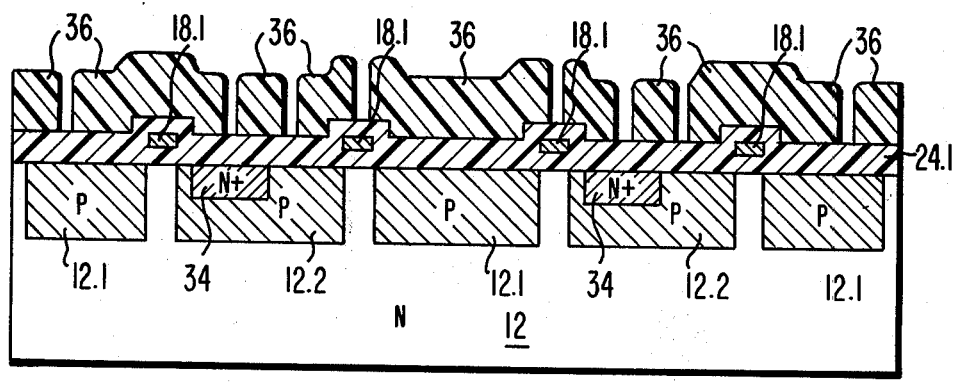

Thereafter, as shown in FIG. 5, photoresist layer 30 is removed and the structure subjected to another oxidation process which serves to provide a silicon dioxide masking layer 24.1 which now includes the exposed portions of layer 24 and an additional layer over the now formed doped polysilicon strips 18.1. This may best be done by utilizing steam and oxygen in a well known manner. Thereafter, a patterned layer of photoresist 36 is provided over the newly formed masking oxide layer 24.1 with the patterned openings in photoresist layer 36 formed wherever it is desired to have a contact opening etched in layer 24.1. The now masked oxide layer 24.1 is subjected to an etch, using a buffered HF solution to provide contact openings in layer 24.1 that extend down to regions 12.1, 12.2, 34 and doped polysilicon lines 18.1. Thereafter, photoresist layer 36 is removed and the structure is provided with a metallization step to provide ohmic contact to the various regions through the previously formed contact openings. The completed structure is shown in detail in FIG. 6b wherein contacts 38 are shown in ohmic contact with emitter (source) regions 12.1, contacts 40 are shown in ohmic contact with floating polysilicon line (gate) 18.1, contacts 42 are shown in ohmic contact with the collector electrode of the NPN transistor, contact 44 is shown in ohmic contact with the collector electrode of the PNP transistor (drain of the MOS) and contact 46 is shown connecting the floating polysilicon lines 18.1 to each other.

Figure 6A:
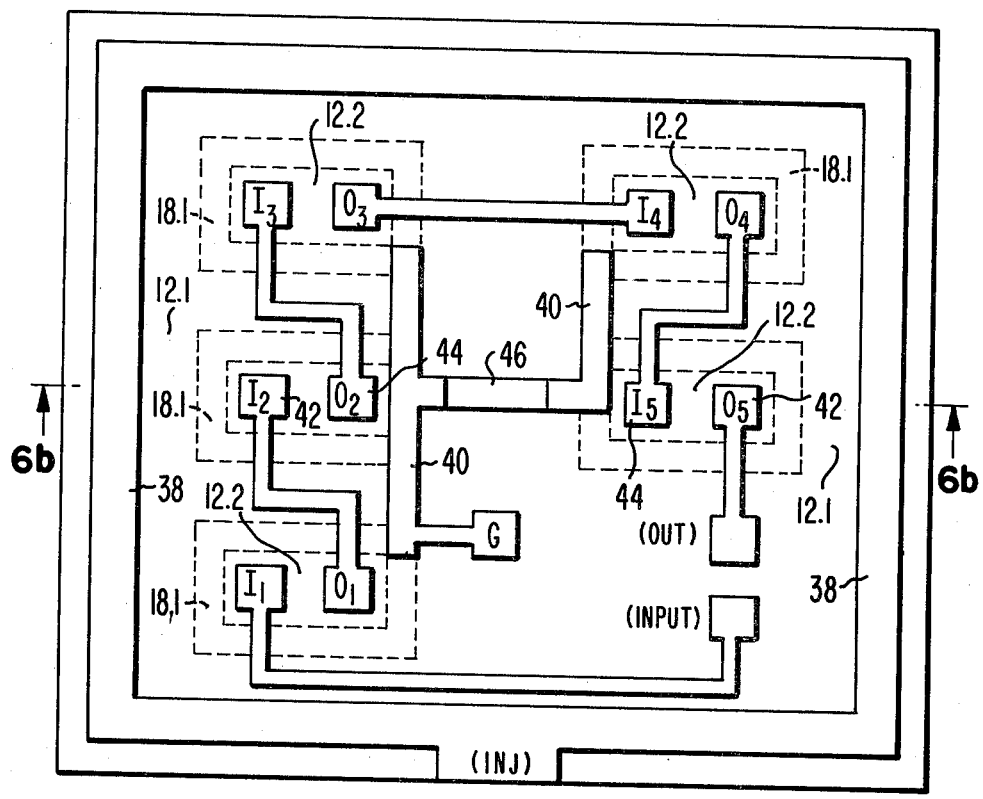
FIG. 6a is a plan view of an I²L ring oscillator using the principals of my invention.
Figure 6B:
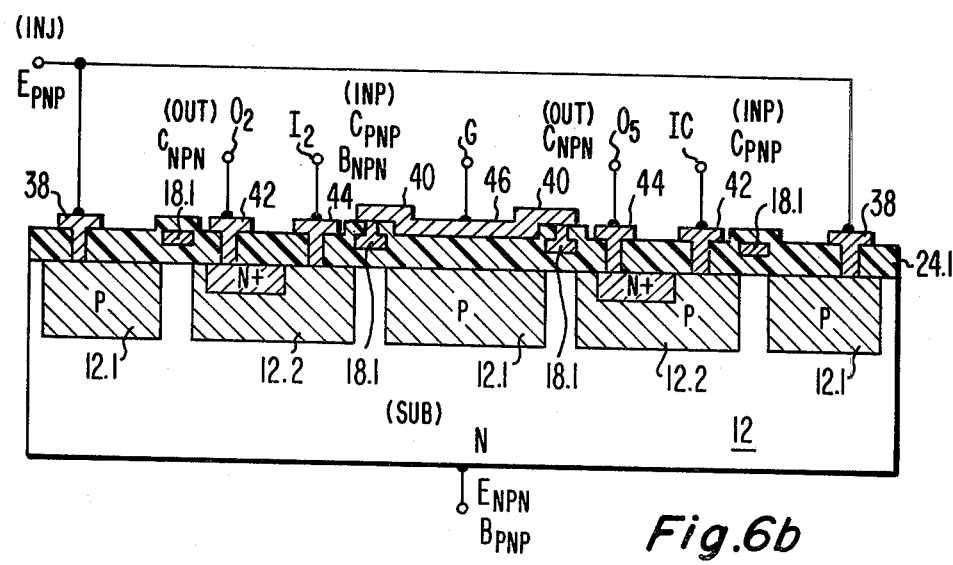
FIG. 6b is a cross-section of FIG. 6a taken through lines b—b.
Figure 6C:
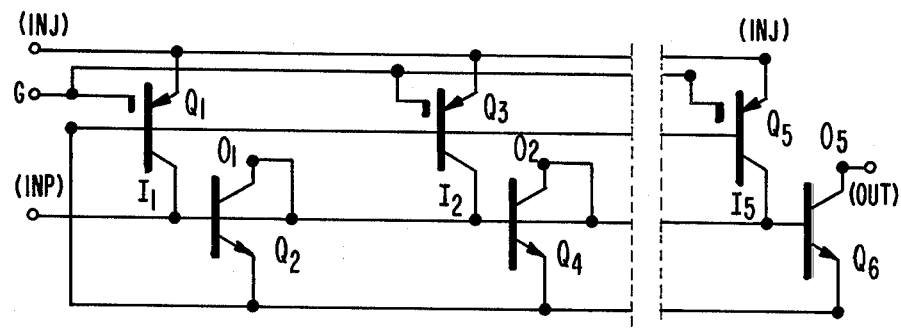
FIG. 6c is a partial schematic diagram of the ring oscillator of FIGS. 6a and 6b.

Referring now to FIGS. 6a, 6b and 6c wherein FIG. 6b represents a cross-section through the plan view presentation of FIG. 6a. These figures relate to a non standard I$^2$L inverter containing a lateral PNP transistor having a floating gate and a vertical NPN transistor. By making contact to the polysilicon lines 18.1 and contacting all the polysilicon lines together, terminating at terminal G, I have thus provided a lateral PNP transistor having a floating gate which is capable of modulating the conduction path between regions 12.1 and 12.2. In the normal operation of the standard lateral PNP transistor the conduction path will be buried within the substrate. However, if an appropriate negative voltage were applied to terminal G, the area immediately under line 18.1, beneath surface 14, will act as a channel region and become inverted. Thus the current flow is enhanced and, depending upon the nature of the signal being applied to terminal G, may also act as a switch.

The structure in FIGS. 6a–6c depicts a simple 5-stage ring oscillator wherein the output of each inverter is connected to the next adjacent input. The emitter of the PNP device is provided with an ohmic connection thereto labelled (INJ) and the input labelled (INP) is connected to I$_1$ the collector of the PNP device and the base of the NPN device. The common base (substrate 12) is also provided with an ohmic contact which is usually at ground potential.

Figures 7A, 7B:
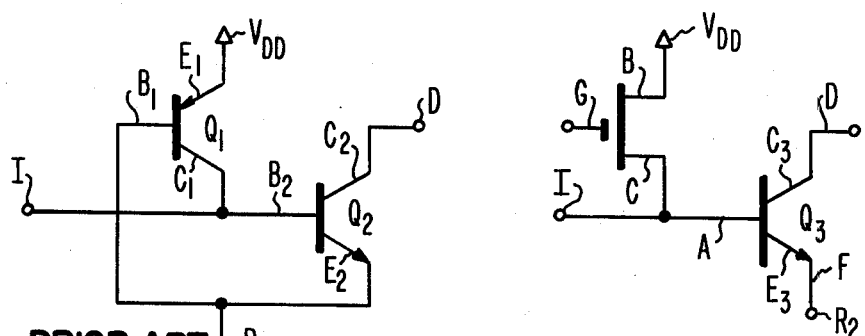
FIG. 7a is a circuit diagram of the prior art I²L configuration.
FIG. 7b is a circuit diagram of an improved I²L configuration using an MOS injection transistor.

Referring now to FIG. 7a there is shown the classic prior art I$^2$L circuit wherein the PNP injector transistor Q$_1$ is shown having an emitter region E$_1$ connected to a source of operating potential V$_{DD}$, a collector region C$_1$ connected to the input terminal I with the base region B$_1$ connected to a source of reference potential R. The vertical NPN transistor Q$_2$ is shown with its collector region C$_2$ connected to the output terminal D, its emitter region E$_2$ connected to the source of reference potential R and its base region B$_2$ connected to collector electrode C$_1$ of injector transistor Q$_1$ as well as to the input terminal I.

FIG. 7b represents the novel configuration achieved using the principals of my invention, wherein the bipolar vertical NPN transistor Q$_3$ has a principal conduction path through its collector and emitter regions (C$_3$-E$_3$) with the collector region connected through line D to the output terminal and the emitter region connected through line F to a source of reference potential R$_2$. The novelty of this I$^2$L circuit resides in the substitution of an insulated gate MOS device Q$_4$ for the PNP transistor of the prior art. As shown, the source region is connected to a source of operating potential V$_{DD}$ through line B while the drain region is connected to the input terminal through line C. As in the prior art, the drain of the injector transistor and the base of the vertical transistor are connected together, through line A, to the input terminal I.

Figure 8:
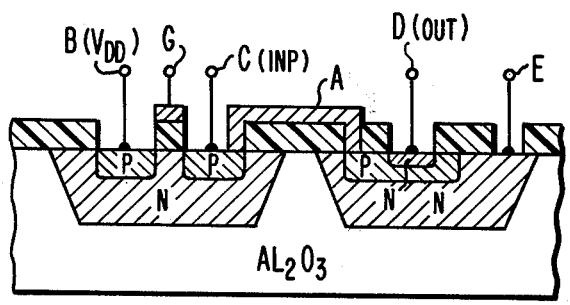
FIG. 8 is a cross-sectional view of one embodiment of fhe I²L configuration of FIG. 7b.

Referring now to FIG. 8 there is shown in cross-section, another embodiment of my invention as applied to silicon-on-sapphire techniques. In this embodiment a substrate of Al₂O₃ is provided in which pockets of semiconductor material are located. In this figure, the injector transistor is shown as an MOS device having terminals B, G, and C connected to the source, gate and drain regions respectively. The vertical transistor, shown on the right side is an NPN device with its base region connected to the collector region of the MOS type through line A. In this particular configuration isolation between both the NPN vertical transistor and the PNP MOS device is provided since each device is formed in its own well in the surface of an electrically insulating body Al₂O₃. The circuit diagram of the embodiment of FIG. 8 would be as shown in FIG. 7b.

Figure 9:
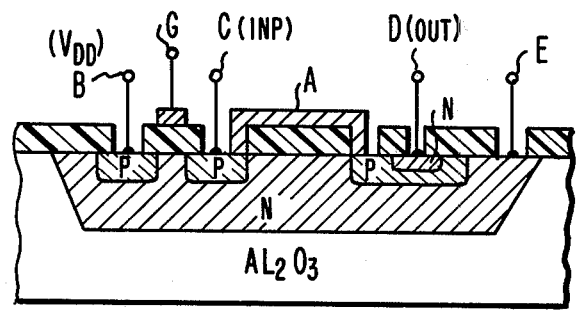
FIG. 9 is a cross-sectional view of another embodiment of the I²L configuration of FIG. 7b.

Referring now to FIG. 9 there is shown a device that is similar to that shown in FIG. 8 except that in this latter embodiment a single N type pocket of semiconductor material is provided in a well just below the surface of the electrically insulating Al$_{2nl}$ O₃ substrate instead of the two pockets previously shown. This latter configuration is desirable in instances where isolation between the MOS and bipolar devices is not required. As in the prior embodiment, the equivalent circuit diagram will be shown in FIG. 7b. The single pocket of N type semiconductor is provided with a pair of P type wells which, together with the intervening N type semiconductive material forms the MOS device. Nearby, a third P type pocket is provided with an N well which, together forms the vertical bipolar transistor. The transistors are connected by lead A to provide the I²L circuit of FIG. 7b.

While the embodiments of FIGS. 8 and 9 were presented in terms of using pockets of semiconductive material embedded in a sapphire substrate, it will be recognized that my invention is not so limited. The principals herein described also apply to SOS devices having silicon islands on the surface of a sapphire substrate.

What is claimed is:

1. A method of fabricating an Integrated Injection Logic device having a lateral transistor with a narrow base width region and a vertical NPN transistor, comprising the steps of:

providing a semiconductor body of a given conductivity type, the body having a common boundary surface;

depositing a layer of oxide on the common boundary surface;

depositing a layer of polycrystalline silicon on the oxide layer;

depositing a layer of apertured masking material on the polycrystalline silicon layer;

etching the unmasked portions of the polycrystalline silicon layer to expose unetched edges of polycrystalline silicon under the masking layer;

doping the exposed edges of the unetched polycrystalline silicon layer to form a narrow line of doped polycrystalline silicon in the polycrystalline silicon layer, the narrow doped line defining the limits of the width of the base region of the lateral transistor;

modifying areas of the semiconductor body to an opposite conductivity type to form emitter and collector regions of the lateral transistor; the collector region of the lateral transistor also functioning as the base region of the NPN transistor depositing a layer of apertured masking material on the layer of oxide, the exposed portions thereof aligned with portions of the collector region of the lateral transistor;

modifying the exposed portion of the collector region of the lateral transistor to the given conductivity type to form the collector region of the NPN transistor, the remaining portion of the body of semiconductor material being common to the base region of the lateral transistor and the emitter region of the NPN transistor;

providing each region with a respective ohmic contact; and providing an ohmic contact to the narrow doped polycrystalline silicon line defining the limits of the width of the base region of the lateral transistor.

* * * * *